United States Patent
Frulio et al.

(10) Patent No.: US 7,379,338 B2
(45) Date of Patent: *May 27, 2008

(54) METHOD AND SYSTEM FOR REGULATING A PROGRAM VOLTAGE VALUE DURING MULTILEVEL MEMORY DEVICE PROGRAMMING

(75) Inventors: Massimiliano Frulio, Milan (IT); Simone Bartoli, Cambiago (IT); Davide Manfre', Bologna (IT); Andrea Sacco, Alessandria (IT)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/635,160

(22) Filed: Dec. 7, 2006

(65) Prior Publication Data

US 2007/0076476 A1 Apr. 5, 2007

Related U.S. Application Data

(63) Continuation of application No. 11/123,754, filed on May 5, 2005, now Pat. No. 7,184,311.

(30) Foreign Application Priority Data

Nov. 26, 2004 (IT) .......................... MI2004A2292

(51) Int. Cl.
*G11C 11/34* (2006.01)
*G11C 16/04* (2006.01)

(52) U.S. Cl. ............ 365/185.18; 365/212; 365/189.09; 365/185.03

(58) Field of Classification Search ............. 365/185.2, 365/185.23, 189.06, 211, 212
See application file for complete search history.

(56) References Cited

U.S. PATENT DOCUMENTS

| 6,292,396 | B1 | 9/2001 | Tailliet |
| 6,456,557 | B1* | 9/2002 | Dadashev et al. .......... 365/226 |
| 6,495,994 | B1 | 12/2002 | Butler et al. |
| 6,560,145 | B2 | 5/2003 | Martines et al. |
| 6,614,674 | B2 | 9/2003 | Butler et al. |
| 2003/0128560 | A1 | 7/2003 | Saiki et al. |
| 2003/0151949 | A1 | 8/2003 | Micheloni et al. |
| 2004/0071031 | A1 | 4/2004 | Butler |

* cited by examiner

*Primary Examiner*—Huan Hoang
*Assistant Examiner*—Michael Weinberg
(74) *Attorney, Agent, or Firm*—Schwegman, Lundberg, & Woessner, P.A.

(57) ABSTRACT

Regulating a program voltage value during multilevel memory device programming includes utilizing a program path duplicate in an output pump regulator circuit. Further, the output pump regulator circuit is utilized to provide a regulated program voltage for memory cell programming, the regulated program voltage correcting for a program path voltage drop.

20 Claims, 4 Drawing Sheets

METHOD AND SYSTEM FOR REGULATING A PROGRAM VOLTAGE VALUE DURING MULTILEVEL MEMORY DEVICE PROGRAMMING

CROSS-REFERENCE TO RELATED APPLICATIONS

This application is a continuation of patent application Ser. No. 11/123,754, filed May 5, 2005, now U.S. Pat. No. 7,184,311, which claims benefit under 35 USC 119 of Italian Application no. MI2004A 002292, filed on Nov. 26, 2004, and which are incorporated herein by reference in their entireties.

FIELD OF THE INVENTION

The present invention relates to regulating a program voltage value during multilevel memory device programming.

BACKGROUND OF THE INVENTION

One of the major issues in the development of semiconductor memory devices is to maximize data storage density, i.e., the number of bits of data that can be stored per unit area. Thus, generally it is desired to develop memory chips having the smallest possible physical size, while storing a maximum amount of data. This has led to the development of memory chips that can store multiple bits of data in a single memory cell, also referred to as multilevel memory chips.

In conventional single bit per cell memory devices, the memory cell assumes one of two information storage states, either an on-state or an off-state. This combination of either on or off defines one bit of information. In bilevel memories, since the cells can only have two different values of threshold voltage, Vt, during the reading operation, it is only necessary to sense whether or not the addressed transistor is conductive. This is generally done by comparing the current flowing through the memory transistor biased with predetermined drain-to-source and gate-to-source voltages with that of a reference transistor under the same bias conditions, either directly through current-mode sensing or after a current-to-voltage conversion through voltage-mode sensing.

Programming and sensing schemes for multilevel memory devices are more complex, typically requiring $2^{n-1}$ voltage references, where n is the number of bits stored in the cell. In multilevel flash memories, program operations are very critical. Allocating 4 (2 bits per cell) or more threshold levels within a defined Vt window reduces the available error range. Read operations are more complicated, and it's very important to have an optimal control on program operations to obtain prefixed threshold voltage.

In programming a typical flash memory cell, a potential (such as, for example, approximately 3-12 volts) is applied to the control gate of the cell, the source terminal is grounded, and the drain terminal is connected to a voltage of about 5 volts. This operation can be performed in an array by selectively applying the pulse to the word line which connects the control gates, and biasing the bit line which connects the drains. This is commonly known in the art as the hot electron injection method of programming flash memory cells. Hot electron injection is used to move charge in the floating gate, thus changing the threshold voltage of the floating gate transistor. By placing the high voltage on the control gate, this generates electrons to flow in the channel and some hot electrons are injected on to the floating gate and change the potential of the floating gate to be more negative. Therefore, injection tends to saturate and the threshold voltage of a floating gate transistor follows the same trend. The state of the memory cell transistor is read or sensed by placing an operating voltage (for example, approximately 4-6 volts) on its control gate and 0.5-1 volts on the drain, and then detecting the level of current flowing between the source and drain to determine which memory state the cell is in.

One of the main difficulties in implementing multilevel nonvolatile memory cells is being able to accurately program the cell, i.e. to place just the amount of charge on the floating gate of the cell transistor that is required to obtain the target value of the threshold voltage. The usual manner that is used in the prior art to deal with the problem of accurate charge placement is by using a cell-by-cell program and verify approach. In the program and verify approach, the programming operation is divided into a number of partial steps and the cell is sensed after every step to determine whether or not the target threshold voltage is achieved, so as to continue the programming if this is not the case. As each cell is independently controlled during programming, this technique allows simultaneous programming of a whole byte or even a number of bytes. This procedure ensures that the target Vt is reached, with the accuracy allowed by the quantization inherent in the use of finite programming steps. However, this process can be very long and must be controlled by on-chip logic circuitry.

Further, when using a program and verify algorithm to obtain the target Vt in the programmed cells and a gate voltage ramp programming to shift the threshold cells, it is critical to have a constant Vd (drain voltage) between different program pulses. Vd variations during program operations involve an uncontrolled threshold voltage in the memory cells. These unforeseeable Vt values will cause many problems in successive read operations.

Typically, in a multilevel flash memory, the Vd program voltage value is greater than the Vdd value. To obtain the right program value when starting from a low external voltage supply, a charge pump is necessary. The output of the charge pump will be switched to the drain during program operations, and control of the Vd program value (i.e., the output pump) is necessary.

Using gate voltage ramp programming, the program Vd value seen by programmed cells must be the same, independent of: the temperature, the number of cells to be programmed, Vdd voltage, program current per cell, etc. Some methods used to reduce the pump output variations include using pump-phase stopping, using a single serial regulator, or using a distributed serial cascode regulator. FIG. 1 illustrates a circuit schematic 100 of a single serial regulator approach, while FIG. 2 illustrates a circuit schematic 200 of a distributed serial cascode regulator approach.

While these methods reduce the pump output variations, they have disadvantages. In particular, the single serial regulator approach 100 reduces the final error regulator but is slow, because a big MOS (with a big gate capacitance) is necessary to supply all the current requested by the memory cells 102 to be programmed. Moreover, while the distributed serial regulator 200 is independent of the number of cells 202 being simultaneously programmed, it is not able to correct the error made by the parasitic resistance of Vd program voltage path (composed by the MOS switches 204). The distributed cascode regulator is faster, because the Vreg voltage is stable and constant in time. However, it is not able to compensate for temperature variations. The final Vd regulated is Vreg−Vtcascode (where Vtcascode is the threshold voltage of the local cascode regulator used), and it is temperature dependent by Vtcascode.

Accordingly, a need exists for a more reliable approach to regulating the program voltage for multilevel memory devices during programming. The present invention addresses such as need.

BRIEF SUMMARY OF THE INVENTION

Aspects for regulating a program voltage value during multilevel memory device programming are described. The aspects include utilizing a program path duplicate in an output pump regulator circuit. Further, the output pump regulator circuit is utilized to provide a regulated program voltage for memory cell programming, the regulated program voltage correcting for a program path voltage drop.

Through the present invention, the difference between the regulated pump output and the real cell drain voltage during programming is removed. Further, temperature and Vdd independence can be achieved for the Vd program voltage. These and other advantages of the aspects of the present invention will be more fully understood in conjunction with the following detailed description and accompanying drawings.

DETAILED DESCRIPTION OF THE INVENTION

The present invention relates to regulating a program voltage value during multilevel memory device programming. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

In accordance with the present invention, regulating a program voltage during multilevel memory device programming is provided. In accordance with the present invention, the difference between the regulated pump output and the real cell drain voltage is removed. Further, the Vd seen by the cells to be programmed is made completely temperature independent. The present invention achieves these advantages by inserting a dummy program path in the output pump regulator, as shown in the circuit schematic 300 of FIG. 3.

Figure 1:
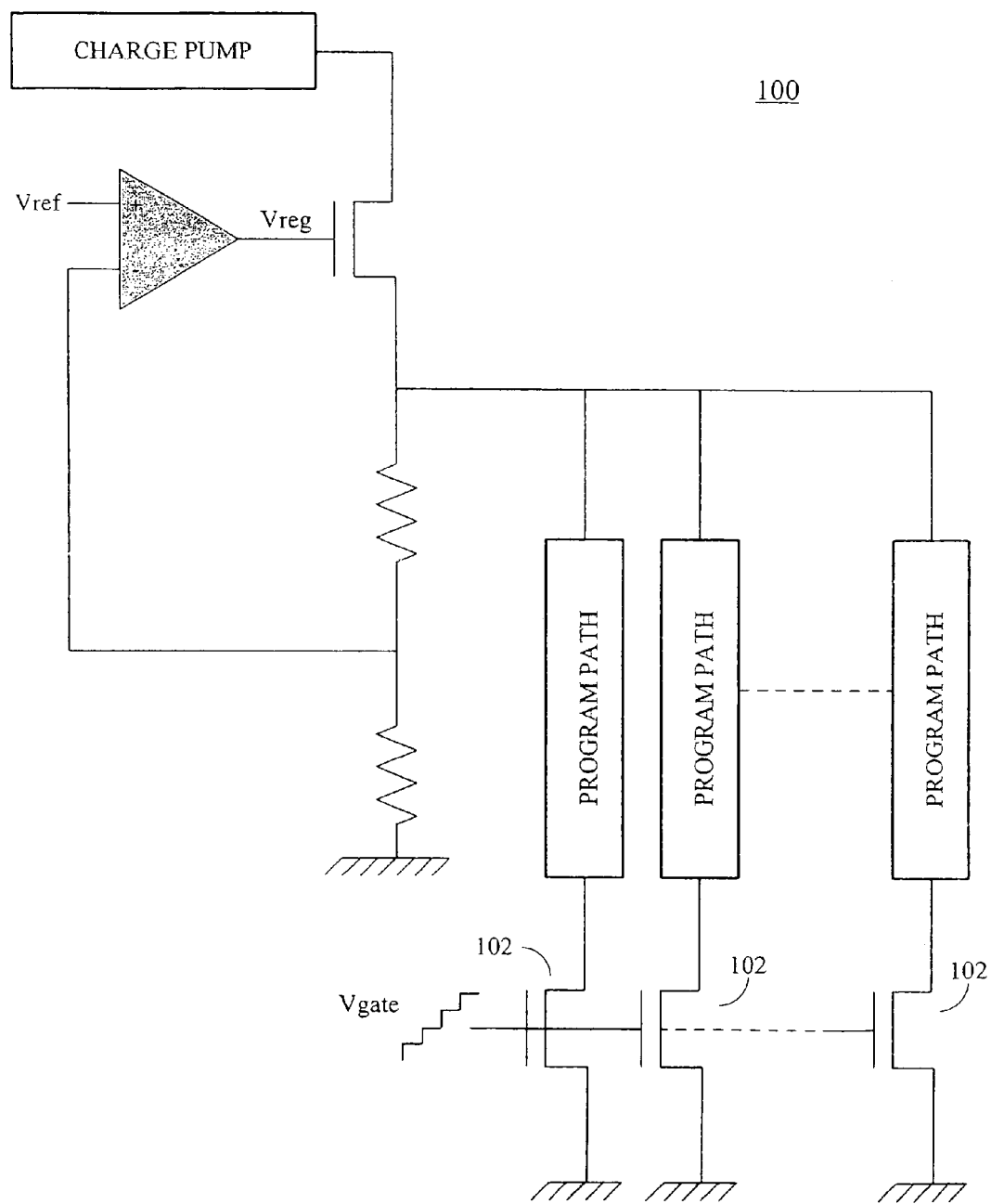
FIG. 1 illustrates a circuit schematic of a single serial regulator approach of the prior art.
Figure 2:
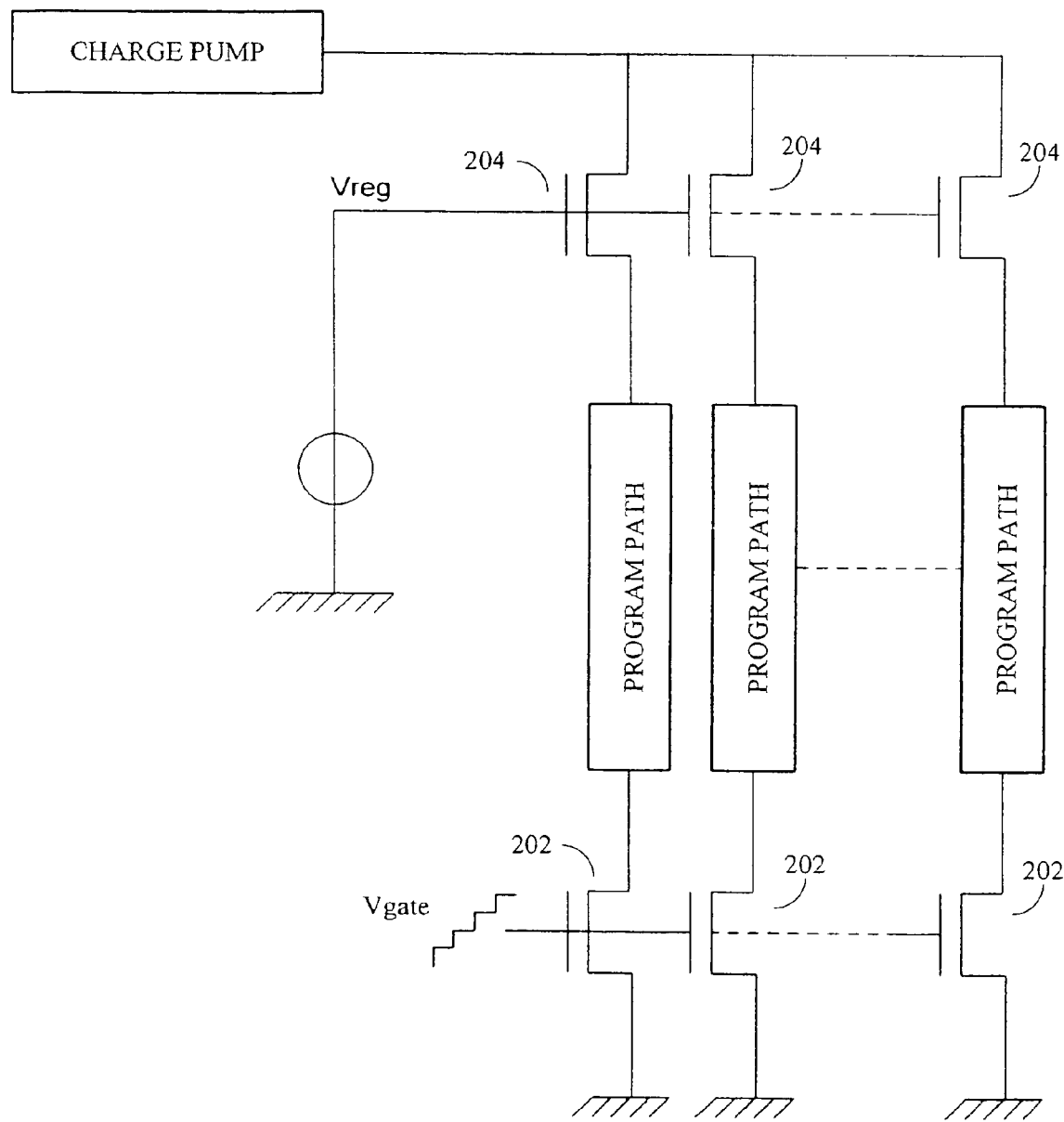
FIG. 2 illustrates a circuit schematic of a distributed serial cascode regulator approach of the prior art.
Figure 3:
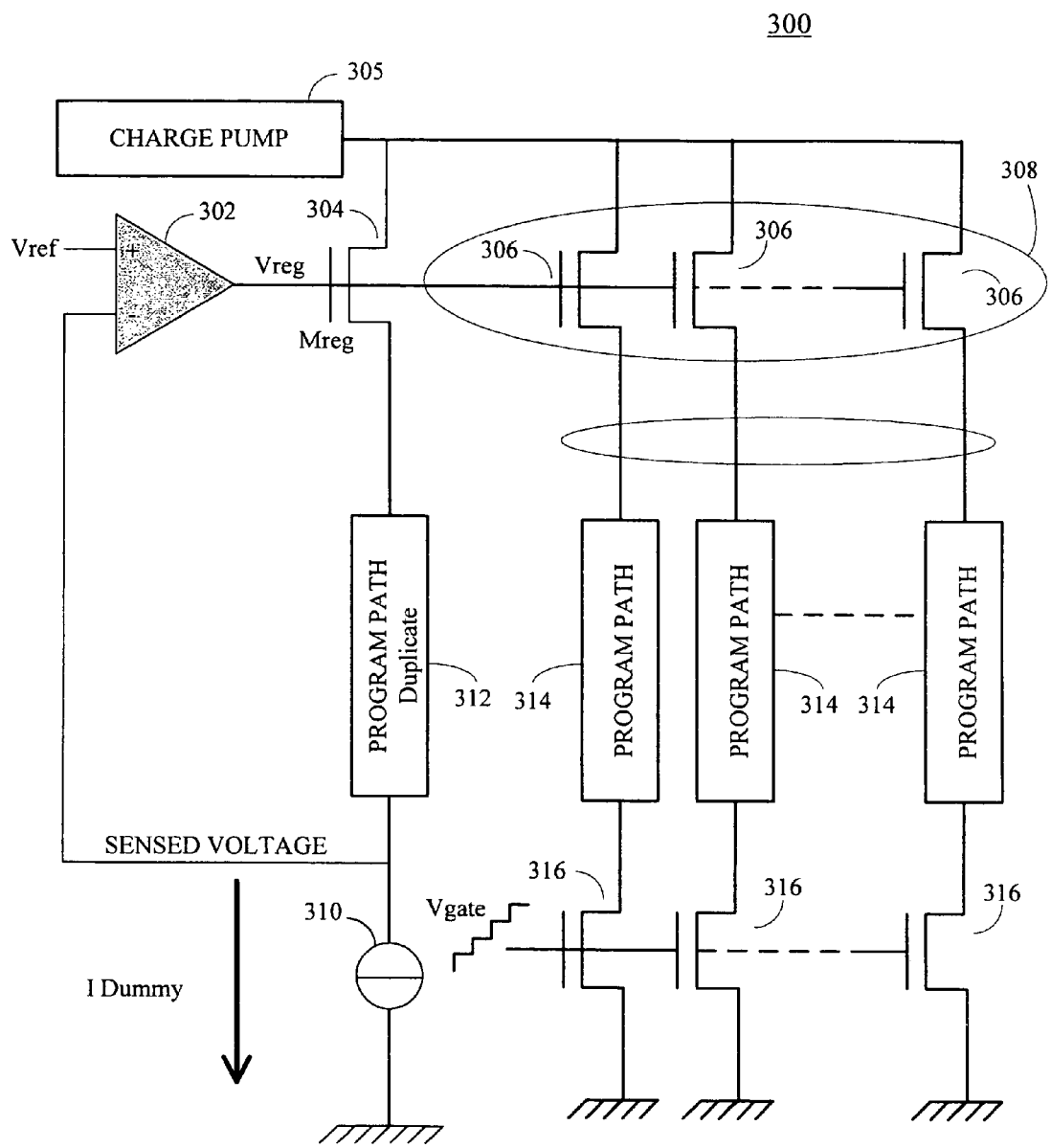
FIG. 3 illustrates a circuit schematic of a regulator approach in accordance with the present invention.

Referring to FIG. 3, an operational amplifier 302 and a MOS, Mreg, 304 provide a serial regulator for a charge pump 305. The serial regulator produces Vreg voltage. Vreg is the regulated voltage which must be applied to all the local NMOS transistors 306 forming a distributed regulator 308 in order to obtain the local cell drain voltage during the program operations. Vreg is produced by an Idummy 310 current, which is as similar as possible to the real program path current, applied to a 'dummy' program path 312, which is a duplicate of devices in a real program path 314 for a memory cell 316. In this manner, the Vd program voltage is temperature and Vdd independent by closed-ring regulation. Further, the Vd program voltage is free from the voltage program path drop, because the sensed voltage also includes the voltage program path drop.

Figure 4A:
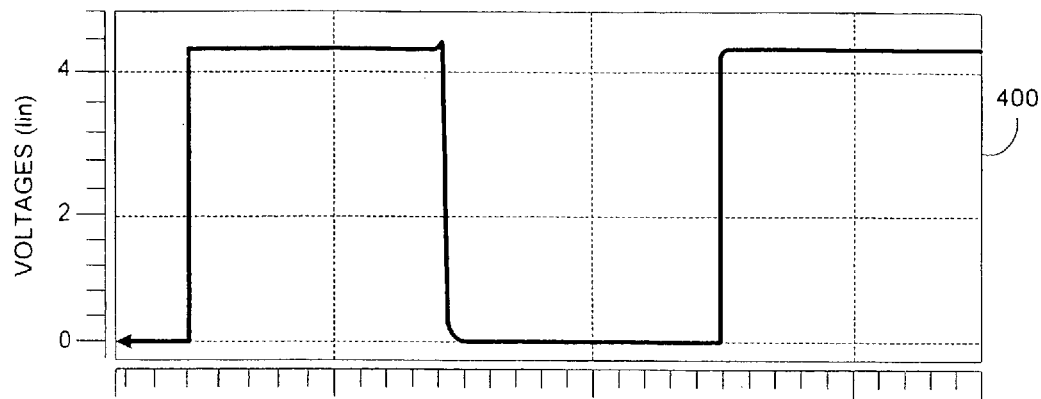
FIG. 4 illustrates simulation graphs comparing results obtained utilizing the approach of the present invention with the results obtained utilizing the approaches of the prior art.
Figure 4B:
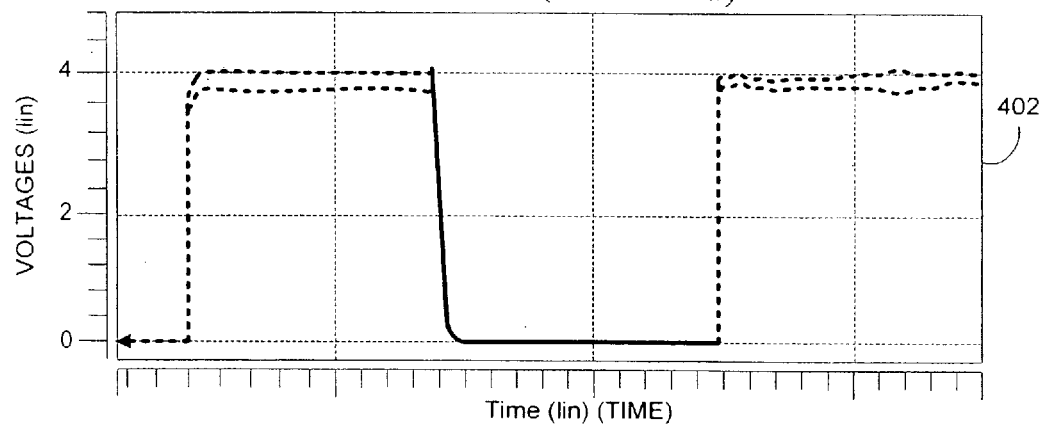
Figure 4C:
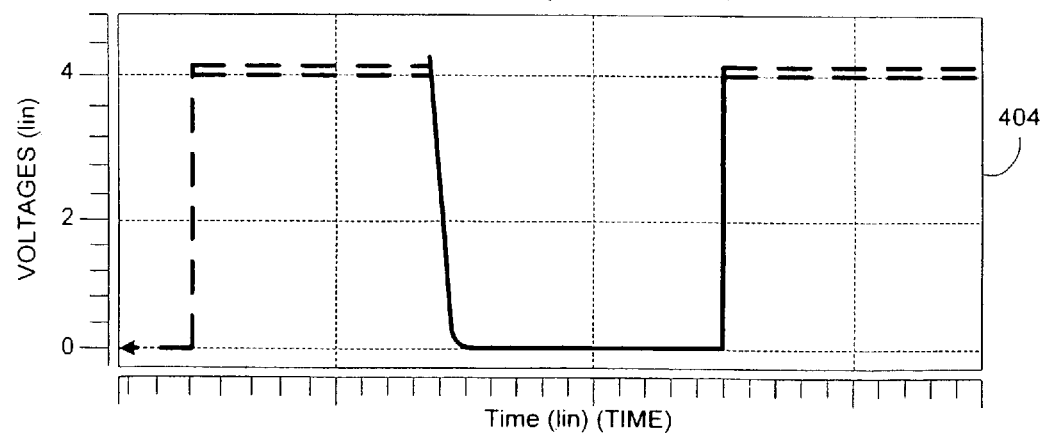

FIG. 4 illustrates simulation graphs that compare results obtained using the open loop, current-compensated pump regulator of the present invention (graph 400), a single serial regulator (graph 402), and a distributed cascode regulator (graph 404). The graphs illustrate the real drain voltage seen by the memory cells during a program operation. Two program pulses are represented, a first program pulse representing the results with many cells programmed, and a second program pulse representing the results with only one cell programmed, in two different temperature corners, with a drain voltage target of 4.25 V.

As can be seen from the graphs of FIG. 4, only the circuit using the approach of the present invention (graph 400) is able to keep the same voltage value, very near to the target value, without problems in the two pulses. The single serial regulator approach (graph 402) is not able to regulate with sufficient speed to the desired voltage value, as demonstrated by the second pulse (note the Vd variation caused by slow Vreg voltage regulations). Further, the final Vd regulated is path resistance dependent (note that this resistance varies with temperature and this causes different voltage drops). The distributed cascode regulator (graph 404) is very fast, but it is not able to remove completely the voltage drop error in all examined cases.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

We claim:

1. A method for regulating a program voltage value during multilevel memory device programming, comprising:
    utilizing an output pump regulator circuit having a duplicate of a program path to provide a regulated program voltage for memory cell programming, the regulated program voltage correcting for a program path voltage drop, wherein the output pump regulator circuit provides closed loop regulation of a charge pump, the closed loop regulation including a feedback path that does not include any resistors that are part of a voltage divider; and
    utilizing a serial regulator with the duplicate of the program path.

2. The method of claim 1 wherein the duplicate of a program path further comprises utilizing path devices matching a single program path coupled to a memory cell being programmed.

3. The method of claim 1 wherein the feedback path includes the duplicate of the program path.

4. The method of claim 1 further comprising utilizing a current source with the duplicate of the program path, the current source providing a current that matches a current of the program path.

5. The method of claim 1 further comprising utilizing a distributed regulator with the serial regulator to obtain a local cell drain voltage during the memory cell programming.

6. The method of claim 1 wherein the memory cell further comprises a flash memory cell.

7. An output pump regulator circuit for regulating a program voltage value during multilevel memory device programming, comprising:
a serial regulator; and
a program path duplicate coupled to the serial regulator, wherein the output pump regulator circuit is coupled to a plurality of memory cells via a plurality of program paths and provides a regulated program voltage to the plurality of memory cells, wherein the regulated program voltage corrects for a program path voltage drop, and wherein the serial regulator provides closed loop regulation of a charge pump, the closed loop regulation including a feedback path that does not include any resistors that are part of a voltage divider.

8. The output pump regulator circuit of claim 7 wherein the program path duplicate further comprises path devices matching a single program path coupled to a memory cell being programmed.

9. The output pump regulator circuit of claim 7 wherein the feedback path includes the duplicate of the program path.

10. The output pump regulator circuit of claim 7 further comprising a current source coupled to the program path duplicate, the current source providing a current that matches the currents of the program paths.

11. The output pump regulator circuit of claim 10 further comprising a distributed regulator coupled to the serial regulator to obtain the regulated program voltage during the memory cell programming.

12. The output pump regulator circuit of claim 7 wherein the plurality of memory cells further comprise flash memory cells.

13. An output pump regulator circuit for regulating a program voltage value during multilevel memory device programming, comprising:
a program path duplicate; and
a current source coupled to the program path duplicate, wherein the output pump regulator circuit is coupled to a plurality of memory cells via a plurality of program paths and provides a regulated program voltage to the plurality of memory cells, wherein the regulated program voltage corrects for a program path voltage drop, wherein the current source provides a current that matches the currents of the program paths, and wherein the output pump regulator circuit provides closed loop regulation of a charge pump, the closed loop regulation including a feedback path that does not include any resistors that are part of a voltage divider.

14. The output pump regulator circuit of claim 13 wherein the program path duplicate further comprises path devices matching a single program path coupled to a memory cell being programmed.

15. The output pump regulator circuit of claim 13 wherein the feedback path includes the duplicate of the program path.

16. The output pump regulator circuit of claim 13 wherein the plurality of memory cells further comprise flash memory cells.

17. A method for regulating a program voltage value during multilevel memory device programming, comprising:
utilizing an output pump regulator circuit having a duplicate of a program path to provide a regulated program voltage for memory cell programming, the regulated program voltage correcting for a program path voltage drop, wherein the output pump regulator circuit provides closed loop regulation of a charge pump, the closed loop regulation including a feedback path that does not include any resistors that are part of a voltage divider; and
utilizing a current source with the duplicate of the program path, the current source providing a current that matches a current of the program path.

18. The method of claim 17 wherein a duplicate of a program path further comprises utilizing path devices matching a single program path coupled to a memory cell being programmed.

19. The method of claim 17 wherein the feedback path includes the duplicate of the program path.

20. The method of claim 17 wherein the memory cell further comprises flash memory cell.

* * * * *